(12) United States Patent
Jung et al.

(10) Patent No.: US 9,177,821 B2
(45) Date of Patent: Nov. 3, 2015

(54) METHOD OF FABRICATING ELECTRONIC CIRCUIT

(71) Applicant: Electronics and Telecommunications Research Institute, Daejeon (KR)

(72) Inventors: Soon-Won Jung, Daejeon (KR); Jae Bon Koo, Daejeon (KR); Chan Woo Park, Daejeon (KR); Bock Soon Na, Daejeon (KR); Sang Chul Lim, Daejeon (KR); Sang Seok Lee, Sejong (KR); Kyoung Ik Cho, Daejeon (KR); Hye Yong Chu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/259,042

(22) Filed: Apr. 22, 2014

(65) Prior Publication Data

US 2015/0147854 A1     May 28, 2015

(30) Foreign Application Priority Data

Nov. 26, 2013  (KR) .................. 10-2013-0144635

(51) Int. Cl.
*H01L 21/338*  (2006.01)
*H01L 21/311*  (2006.01)
*H01L 29/66*  (2006.01)

(52) U.S. Cl.
CPC ........ *H01L 21/311* (2013.01); *H01L 29/66477* (2013.01)

(58) Field of Classification Search
None
See application file for complete search history.

(56) References Cited

U.S. PATENT DOCUMENTS

2010/0110048 A1*  5/2010  Min et al. .................. 345/204
2010/0207301 A1*  8/2010  Suh et al. .................. 264/447

OTHER PUBLICATIONS

Stephanie P. Lacour et al., "Stiff subcircuit islands of diamondlike carbon for stretchable electronics", Journal of Applied Physics, Jul. 14 2006, pp. 1-6, vol. 100, No. 014913, American Institute of Physics.
Jeong-Yun Sun et al., "Debonding and fracture of ceramic islands on polymer substrates", Journal of Applied Physics, Jan. 10, 2012, pp. 1-7, vol. 111, No. 013517, American Institute of Physics.
Jeong-Yun Sun et al., "Islands stretch test for measuring the interfacial fracture energy between a hard film and a soft substrate" Journal of Applied Physics, Jun. 12, 2013, pp. 1-6, vol. 113, No. 223702, Aip Publishing Llc.
Dae-Hyeong Kim et al., "Materials and noncoplanar mesh designs for integrated circuits with linear elastic responses to extreme mechanical deformations", Pnas, Dec. 2, 2008, pp. 18675-18680, vol. 105, No. 48.
Kyungyea Park et al., "Stretchable, Transparent Zinc Oxide Thin Film Transistors", Advanced Functional Materials, Aug. 18, 2010, pp. 3577-3582, vol. 20, Wiley-Vch Verlag GmbH & Co. KGaG, Weinheim.
Dae-Hyeong Kim et al., "Stretchable and Foldable Silicon Integrated Circuits", Science, Apr. 25, 2008, pp. 507-511, vol. 320, American Association for the Advancement of Science, Washinton, Dc.

(Continued)

*Primary Examiner* — Kyoung Lee

(57) ABSTRACT

Provided is a method of fabricating an electronic circuit. The method includes preparing a substrate, forming a polymer film on the substrate, patterning the polymer film to form a polymer pattern, and forming an electronic device on the polymer pattern.

18 Claims, 15 Drawing Sheets

(56) References Cited

OTHER PUBLICATIONS

Tsuyoshi Sekitani et al., "A Rubberlike Stretchable Active Matrix Using Elastic Conductors", Science, Sep. 12, 2008, pp. 1468-1472, vol. 321, No. 1468, American Assoication for the Advancement of Science, Washington, Dc.

Ingrid M. Graz et al., "Silicone substrate with in situ strain relief for stretchable thin-film transistors", Applied Physics Letters, Mar. 22, 2011, pp. 1-3, vol. 98, No. 124101, American Institute of Physics.

Alessia Romeo et al., "Elastomeric substrates with embedded stiff platforms for stretchable electronics", Applied Physics Letters, Apr. 2, 2013, pp. 1-5, vol. 102, No. 131904, American Institute of Physics.

* cited by examiner

METHOD OF FABRICATING ELECTRONIC CIRCUIT

CROSS-REFERENCE TO RELATED APPLICATIONS

This U.S. non-provisional patent application claims priority under 35 U.S.C. §119 of Korean Patent Application No. 10-2013-0144635, filed on Nov. 26, 2013, the entire contents of which are hereby incorporated by reference.

BACKGROUND OF THE INVENTION

The present invention disclosed herein relates to a method of fabricating an electronic circuit, and more particularly, to a method of fabricating a stretchable or foldable electronic circuit.

Unlike typical flexible devices having only a bendable function, stretchable electronic circuits may be applicable to various fields, such as a sensor skin for robots, wearable communication devices, internal or attachable bio-elements, and next-generation displays. Accordingly, studies for implementing stretchable electronic circuits have been conducted.

In order to implement a stretchable electronic circuit, technologies for forming a device region and a wiring region on a flexible substrate are required. In typical flexible devices, a device region is separately formed and then the device region is attached on a flexible substrate to form a flexible device. Besides, semiconductor processes are used in order to form the device region. However, since such flexible substrates do not allow for the formation of the device region and the wiring region in a continuous semiconductor process, such stretchable electronic devices have limitations in that high fabrication costs are required.

SUMMARY OF THE INVENTION

The present invention provides a method of fabricating an electronic circuit with process simplicity and improved reliability.

Embodiments of the present invention provide methods of fabricating an electronic circuit including: preparing a substrate, forming a polymer film on the substrate, patterning the polymer film to form a polymer pattern, and forming an electronic device on the polymer pattern.

In some embodiments, the patterning of the polymer film to form a polymer pattern may further include forming a photoresist pattern on the polymer film, etching a portion of the polymer film exposed to the photoresist pattern, selectively removing the photoresist pattern, and performing a heat treatment process to cure the polymer pattern.

In other embodiments, the polymer film may include a polyimide.

In still other embodiments, the substrate may include a device region in which the polymer pattern is formed, and a wiring region other than the device region, and the above method may, prior to forming the electronic device, further include forming the wiring region such that the wiring region alternately and repeatedly has a concave surface and a convex surface.

In even other embodiments, the above method may further include forming a metal wiring on the wiring region, wherein the metal wiring may be conformally formed on the wiring region to alternately and repeatedly have a concave surface and a convex surface, extend to an upper surface of the polymer pattern and be disposed between the polymer pattern and the electronic device.

In yet other embodiments, the metal wiring extending to one surface of the polymer pattern and the metal wiring extending to the other surface of the polymer pattern may be formed spaced from each other.

In further embodiments, the polymer pattern may include a first polymer pattern and a second polymer pattern facing each other, wherein the metal wiring extending to one surface of the first polymer pattern and the metal wiring extending to the other surface of the second polymer pattern may be electrically connected to each other such that an electronic circuit on the first polymer pattern and an electronic circuit on the second polymer pattern may be electrically connected to each other.

In still further embodiments, the forming of the electronic device may include: forming a source electrode and a drain electrode on the polymer pattern, forming a semiconductor layer on the source electrode and the drain electrode, forming a gate insulating layer covering the source electrode, the drain electrode, and the semiconductor layer on the polymer pattern, and forming a gate electrode on the gate insulating layer.

In even further embodiments, the preparing of the substrate may include a wiring region having a concave surface and a convex surface alternately and repeatedly formed on a portion of the substrate, and a device region is defined by the wiring region.

In yet further embodiments, the device region may include a flat surface or concave surface and a convex surface alternately and repeatedly formed thereon.

In much further embodiments, the patterning of the polymer film to form the polymer pattern may include forming a photoresist pattern on the device region of the substrate and etching a portion of the polymer film on the wiring region of the substrate by using the photoresist pattern as an etching mask.

In other embodiments of the present invention, methods of fabricating an electronic circuit include preparing a first substrate, sequentially forming a sacrificial film and a polymer film on the substrate, patterning the polymer film to form a polymer pattern on the sacrificial film, forming a second substrate covering the polymer pattern on the sacrificial film, separating the second substrate from the sacrificial film to form the second substrate in which the polymer pattern is embedded, and forming an electronic device on the polymer pattern.

In some embodiments, the polymer pattern may include a cured polyimide.

In other embodiments, the forming of the second substrate may include applying a stretchable elastomer material on the sacrificial film, and curing the stretchable elastomer material through a heat treatment process.

In still other embodiments, the stretchable elastomer material may include poly-dimethylsiloxane (PDMS).

In even other embodiments, the second substrate may include a device region in which the polymer pattern is formed, and a wiring region other than the device region, and the above method may, prior to forming the electronic device, further include forming the wiring region such that the wiring region alternately and repeatedly has a concave surface and a convex surface.

In yet other embodiments of the present invention, the method may further include comprising forming a metal wiring on the wiring region of the second substrate, wherein the metal wiring may extend to an upper surface of the polymer to be electrically connected to the electronic device.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
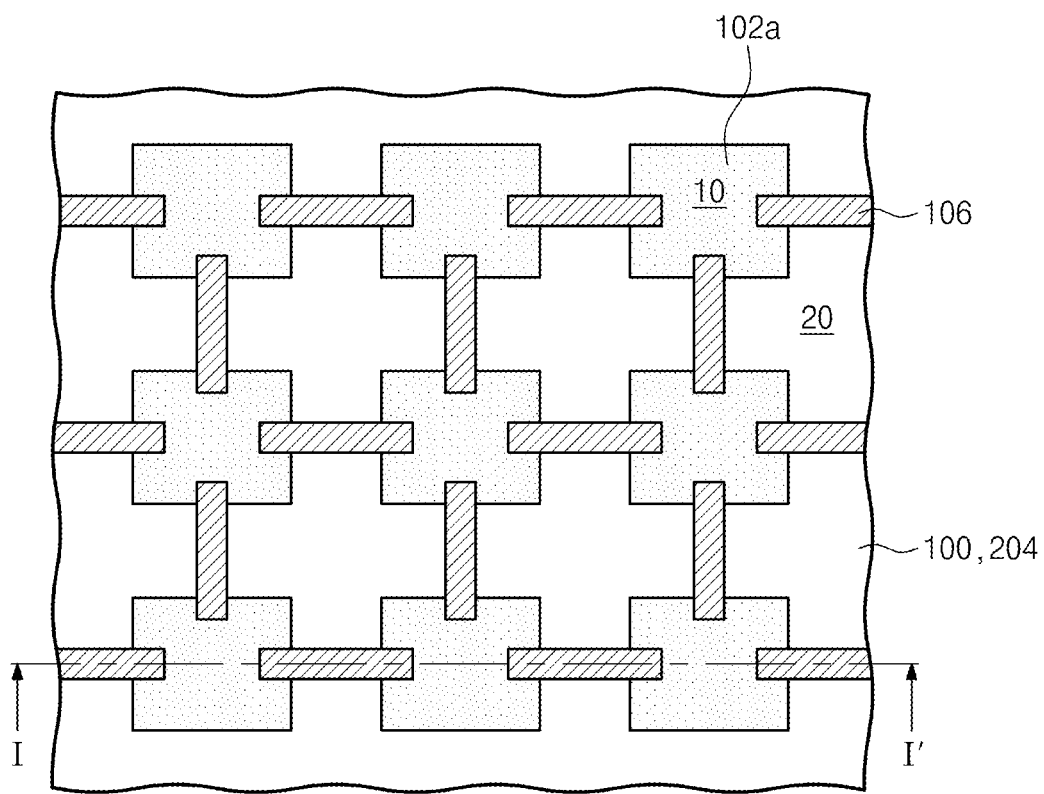
FIG. 1 is a top plan view illustrating an electronic circuit according to exemplary embodiments of the present invention.

Other advantages and features of the present invention, and implementation methods thereof will be clarified through following embodiments described with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining exemplary embodiments while not limiting the present invention. The terms of a singular form may include plural forms unless otherwise specified. Also, the meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, this should not be constructed as limited to the scope of the present invention.

Figure 5A:
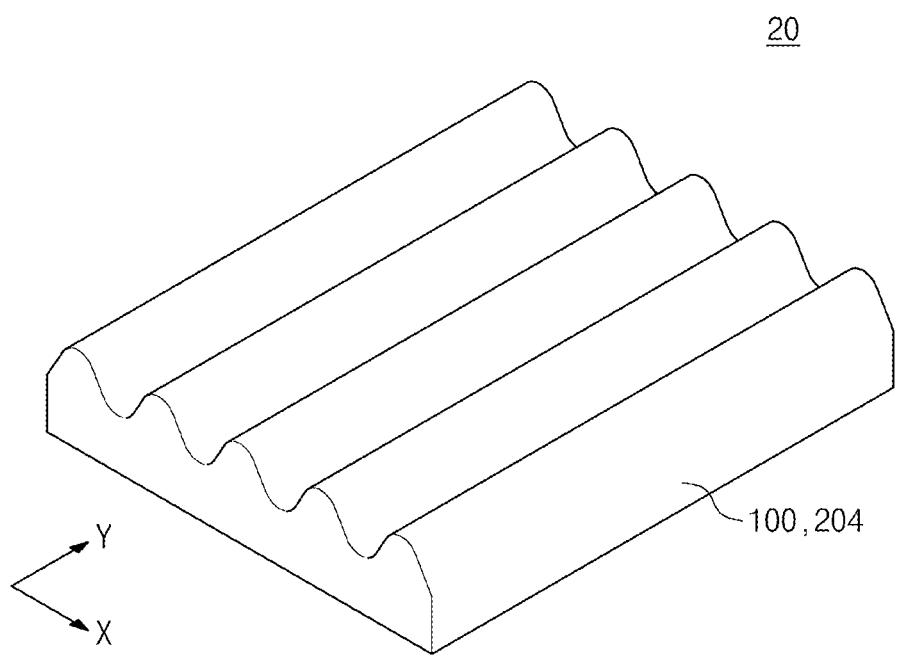
FIGS. 5A and 5B are perspective views illustrating a wiring region of a substrate on which a metal wiring is formed according to exemplary embodiments of the present invention.
Figure 5B:
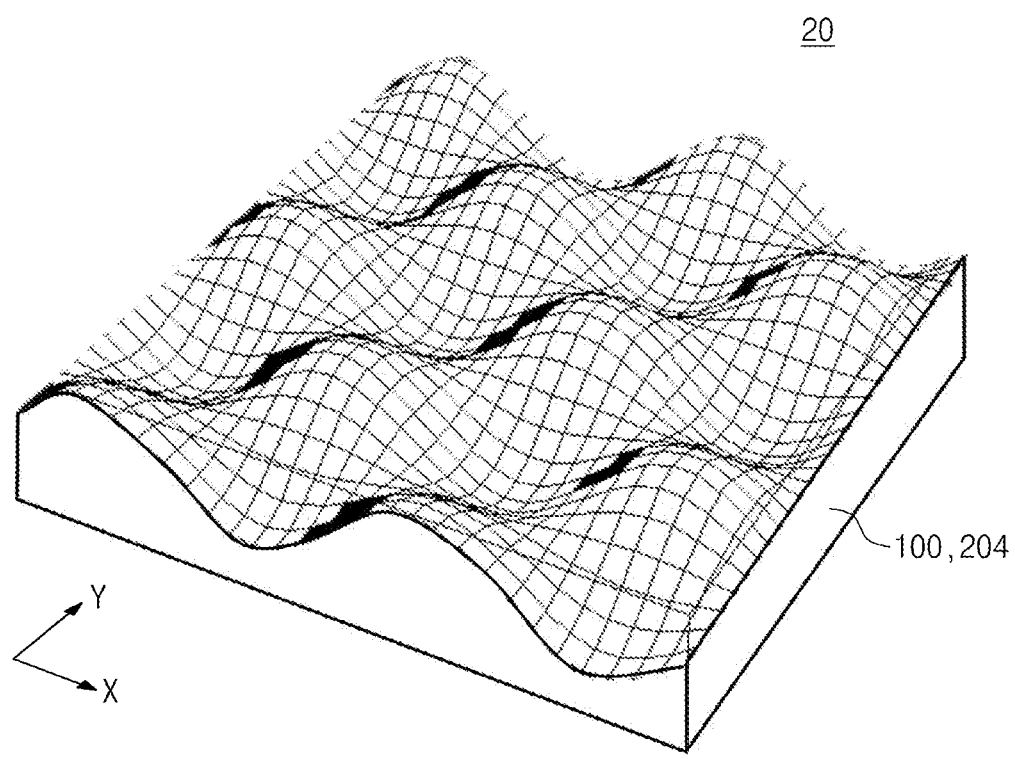

FIG. 1 is a top plan view illustrating an electronic circuit according to exemplary embodiments of the present invention. FIGS. 2A to 2I are cross-sectional views illustrating a method of fabricating an electronic circuit according to exemplary embodiments of the present invention, taken along line I-I' in FIG. 1. FIGS. 5A and 5B are perspective views illustrating a wiring region of a substrate on which a metal wiring is formed according to exemplary embodiments of the present invention.

Figure 2A:
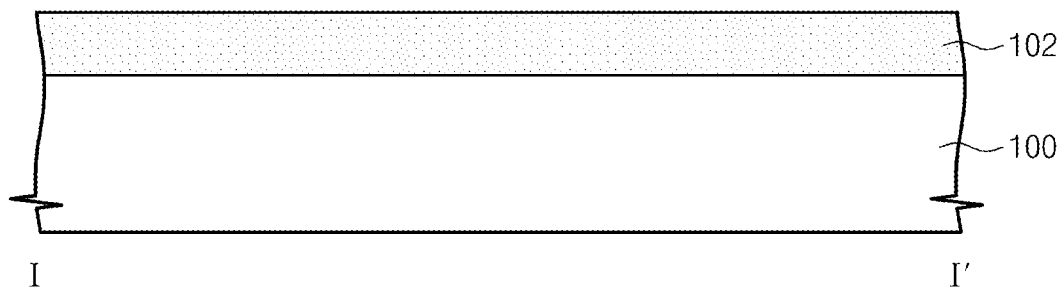
FIGS. 2A to 2I are cross-sectional views illustrating a method of fabricating an electronic circuit according to exemplary embodiments of the present invention, taken along line I-I' in FIG. 1.

Referring to FIG. 2A, a polymer film 102 is coated on a substrate 100. The substrate 100 may include a stretchable elastomer material and may be, for example, a Poly-dimethylsiloxane (PDMS) substrate. The polymer film 102 may be coated on the substrate 100 by a direct coating, a spin coating, a bar coating or a printing process. The polymer film 102 may include a polyimide. The polymer 102 may have a thickness thinner than the substrate 100. The polymer film 102 coated on the substrate 100 may undergo heat treatment at a predetermined temperature to have hardness for patterning in a subsequent patterning process.

Figure 2B:
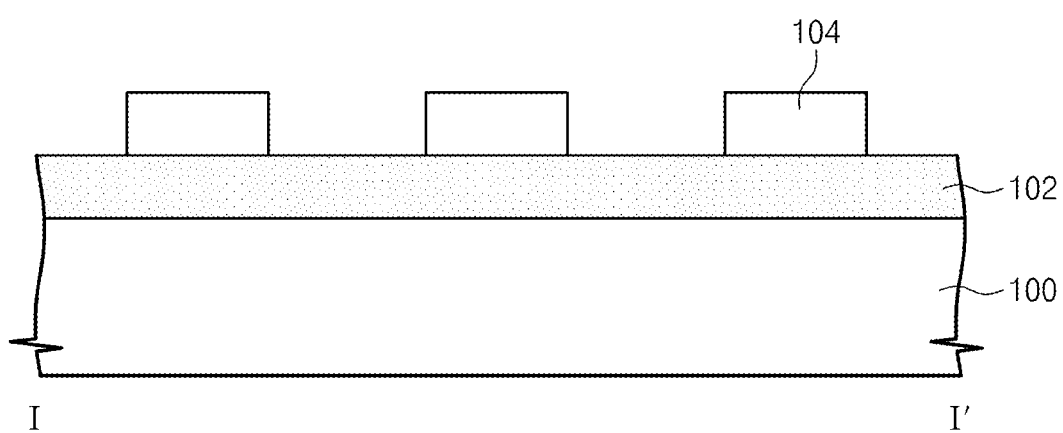

Referring to FIG. 2B, a photoresist pattern 104 is formed on the polymer film 102. The photoresist pattern 104 may be used as an etching mask for patterning the polymer film 102.

Figure 2C:
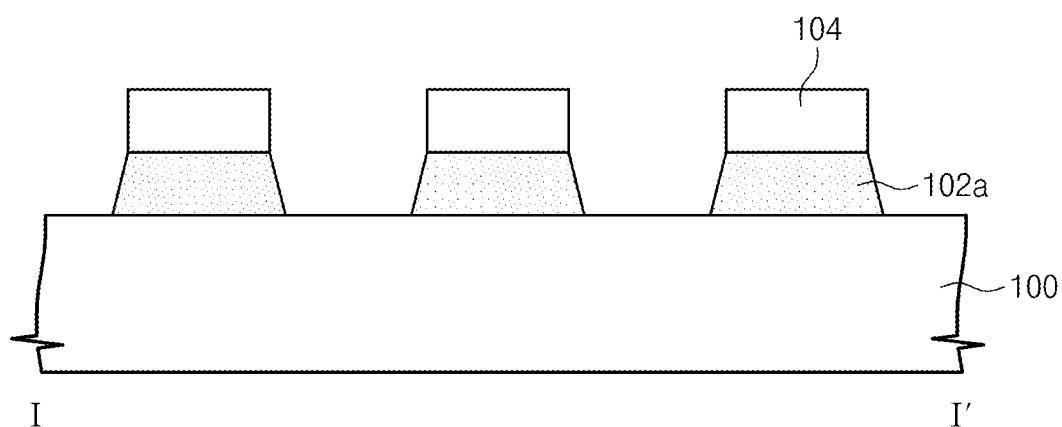

Referring to FIG. 2C, in order to pattern the polymer film 102, the polymer film 102 exposed to the photoresist pattern 104 is etched to form a polymer pattern 104. A portion of the polymer film 102 exposed to the photoresist pattern 104 may be removed to expose an upper surface of the substrate 100. The polymer film 102 may be patterned by wet etching or dry etching. The polymer pattern 102a may have a width equal to the photoresist pattern 104. On the other hand, the width of the upper surface of the polymer pattern 102a is equal to that of the photoresist pattern, and a lower surface of the polymer pattern 102a may have a width wider than the upper surface of the polymer pattern 102a.

Figure 2D:
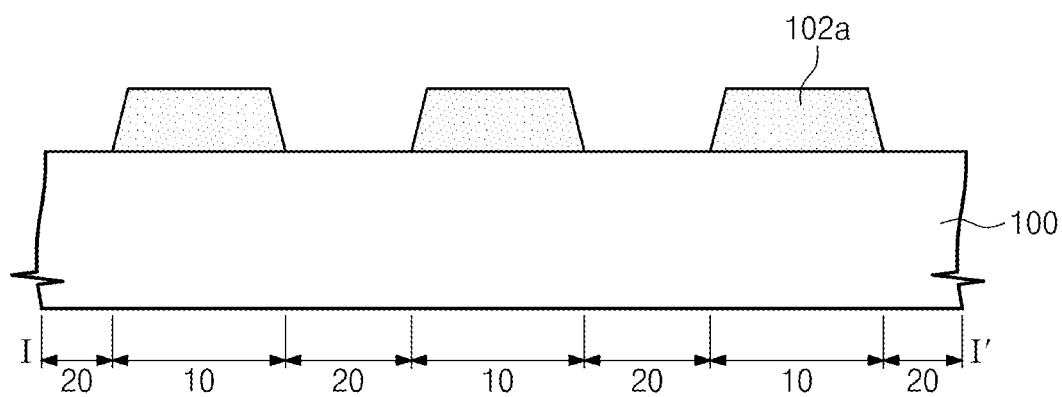

Referring to FIGS. 1 and 2D, the photoresist pattern 104 is removed. The photoresist pattern 104 may be removed by ashing. A heat treatment may be carried out to rigidly cure the polymer pattern 102a from which the photoresist pattern 104 is removed. The heat treatment temperature may be not less than about 300° C. In a subsequent process, electronic devices (for example, transistors) are formed on the polymer pattern 102a.

The substrate 100 includes a device region 10 and a wiring region 20. The device region 10 is a region on which the polymer pattern 102a is formed and the wiring region 20 is a remaining region of the substrate 100 other than the device region 10.

Figure 2E:
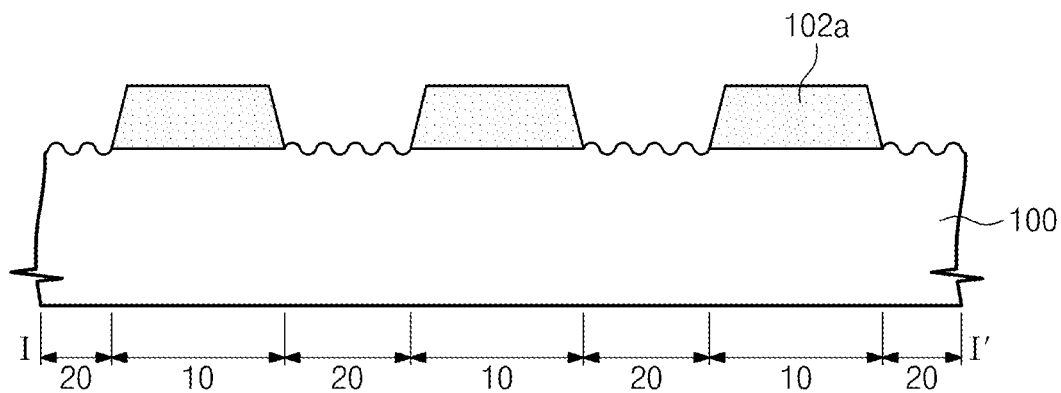

Referring to FIGS. 1 and 2E, the wiring region 20 of the substrate 100 is formed to locally have a wrinkled surface. In detail, the wiring region 20 may alternately and repeatedly have a concave surface and a convex surface.

Referring to FIG. 5A, the concave surface and the convex surface are alternately and repeatedly connected to each other in a first direction (X-direction) and may extend in a second direction (Y-direction).

On other hand, referring to FIG. 5B, the concave surface and the convex surface are alternately and repeatedly connected to each other at the same time to have a two-dimensional wrinkled surface.

The wrinkled surface of the wiring region 20 may be formed by a physical process (for example, a plasma process), a chemical process (for example, an etching process) or a mold process. However, methods of forming the surface of the wiring region 20 are not limited to the above-described methods.

Figure 2F:
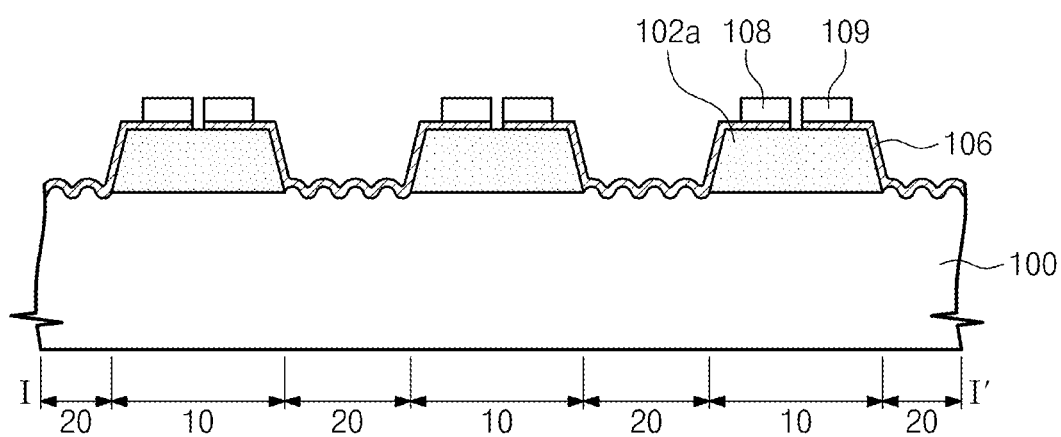

Referring to FIGS. 1 and 2F, a metal wiring 106 is formed on the wiring region 20 of the substrate 100. The metal wiring 106 is conformally formed on the wiring region 20 to have the same profile as the surface of the wiring region 20. The metal wiring 106 may be formed to extend from the surface of the wiring region 20 to an upper surface of the polymer pattern 102a.

The metal wiring 106 extending to one surface of the polymer pattern 102a and the metal wiring 106 extending to the other surface of the polymer pattern 102a are formed spaced from each other on the same surface of the polymer pattern 102a so as not to be electrically connected.

The metal wiring 106 formed between the polymer patterns 102a facing each other extends to the upper surface of each of the polymer patterns 102a. For example, one of a pair of the polymer patterns 102a facing each other is defined as a first polymer pattern and the other is defined as a second polymer pattern. The metal wiring 106 extending to one surface of the first polymer pattern and the metal wiring 106 extending to the other surface of the second polymer pattern are electrically connected to each other, so that an electronic circuit on the first polymer pattern and an electronic circuit on the second polymer pattern may be electrically connected to each other.

A source electrode 108 and a drain electrode 109 are formed electrically spaced apart from each other on the metal wiring 106 on the upper surface of the polymer pattern 102a. The source and drain electrodes 108 and 109 may be formed by a photolithography process, a Lift-Off process, a deposition process using a shadow mask, or a printing process. The source and drain electrodes 108 and 109 may include a metal, such as tungsten (W), copper (Cu), aluminum (Al), chromium (Cr), molybdenum (Mo), silver (Ag), or gold (Au).

Figure 2G:
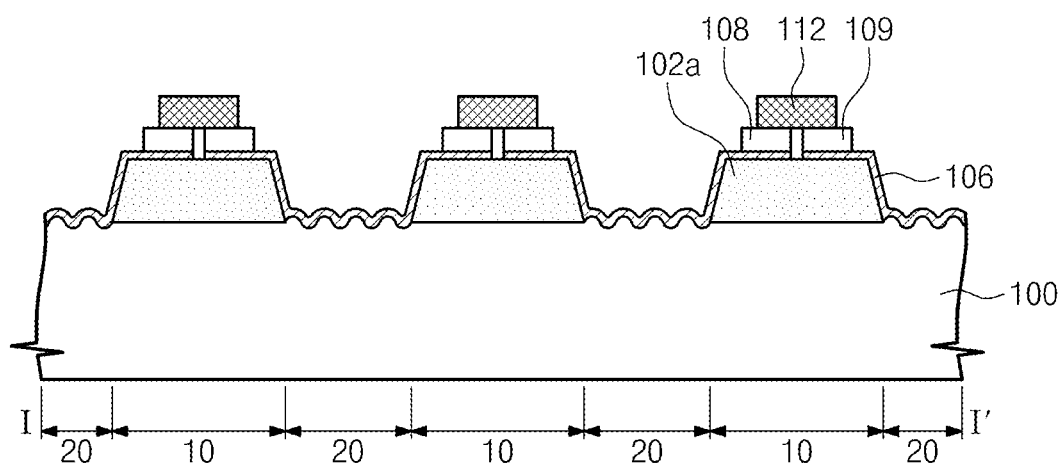

Referring to FIGS. 1 and 2G, a semiconductor layer 112 is formed on the source and drain electrodes 108 and 109. The semiconductor layer 112 may be formed to cover upper surfaces of the source and drain electrode 108 and 109 and to be positioned between the source and drain electrodes 108 and 109. The semiconductor layer 112 may be formed by a vacuum deposition, a solution process, or a printing process. The semiconductor layer 112 may be an organic semiconductor layer, a silicon semiconductor layer or an oxide semiconductor layer. In order to improve device characteristics, a heat treatment process may be added to the semiconductor layer 112.

Figure 2H:
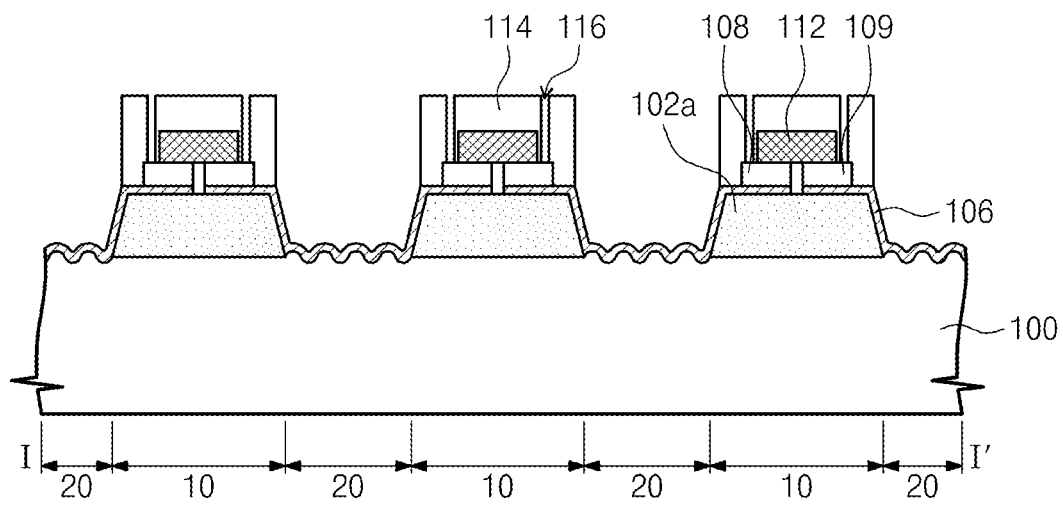

Referring to FIGS. 1 and 2H, a gate insulating layer 114 covering the source electrode 108, the drain electrode 109, and the semiconductor layer 112 is formed on the polymer pattern 102a. The gate insulating layer 114 may include an organic material (for example, perylene), an inorganic material (for example, silicon dioxide ($SiO_2$)) or silicon nitride ($SiN_x$)). In order to improve device characteristics, a heat treatment process may be added to the gate insulating layer 114.

Via holes 116 are formed in the gate insulating layer 114. The via holes 116 pass through the gate insulating layer 114, and each of the via holes 116 may be formed to expose a portion of the upper surface of the source and drain electrodes 108 and 109. The via holes 116 may be formed by a dry etching process or a wet etching process.

Figure 2I:
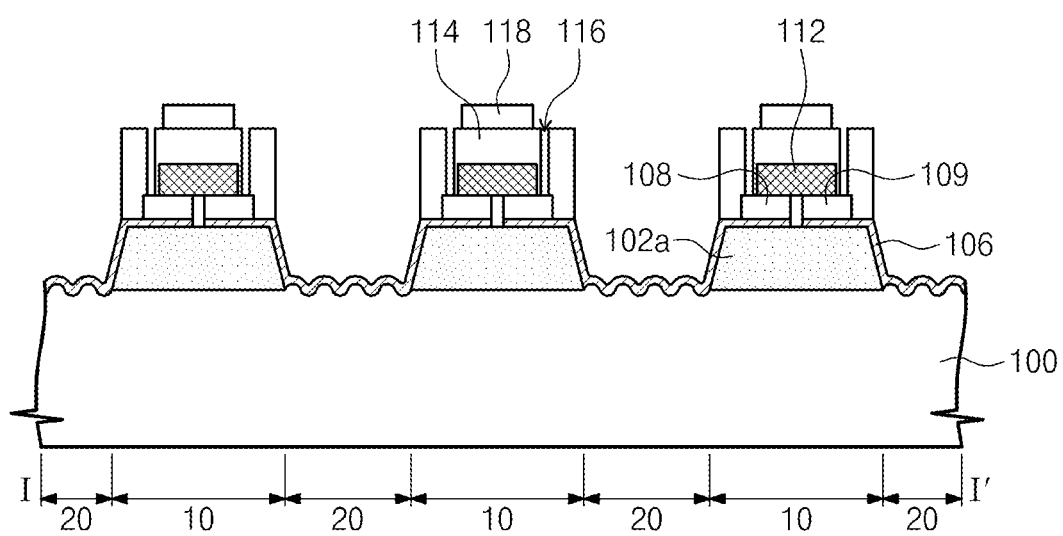

Referring to FIGS. 1 and 2I, a gate electrode 118 is formed on the gate insulating layer 114. In detail, the gate electrode 118 may be formed on the gate insulating layer 114 between the via holes 116. The gate electrode 118 may include polycrystalline silicone or a metal.

According to an embodiment of the present invent, the polymer pattern 102a on which an electronic device is disposed is formed on the substrate 100 by using a coating process and a patterning process. The above-mentioned processes can allow for easy control of the size and thickness of the polymer pattern 102a at low costs. Furthermore, after the polymer pattern 102a is formed, a wiring region 20 which has a wrinkled surface and on which the metal wiring 106 is formed may be formed in the substrate 100. Therefore, the metal wiring 106 and an electronic device can be performed on one substrate by a continuous process.

FIGS. 3A through 3D are cross-sectional views illustrating a practical application of a method of fabricating an electronic circuit according to an embodiment of the present invention, taken along line I-I' in FIG. 1. For simplicity of description, like reference numerals are used to designate like elements and description thereof will be omitted.

Referring to 3A, the substrate 100 is prepared. The substrate 100 includes the device region 10 and the wiring region 20. The wiring region 20 of the substrate 100 may be formed on a portion of the substrate 100 to alternately and repeatedly have a concave surface and a convex surface by a physical process (for example, a plasma process), a chemical process (for example, an etching process), or a mold process. A remaining region of the substrate 100 other than the wiring region 20 may be defined as the device region 10. The device region 10 may have a flat surface.

Meanwhile, an entire surface of the substrate 100 may be formed to alternately and repeatedly have a concave surface and a convex surface by conducting a physical process (for example, a plasma process), a chemical process (for example, an etching process) or a mold process on the entire surface of the substrate 100. Therefore, the device region 10 and the wiring region 20 of the substrate 100 may both have wrinkled surfaces. Although the device region 10 is formed to have the wrinkled surface, since the electronic device is formed on the polymer pattern 102a formed in a subsequent process, the electronic device can be prevented from being damaged due to an external pressure. Methods of forming the surface of the substrate 100 having the wrinkled surface are not limited to these methods.

Figure 3A:
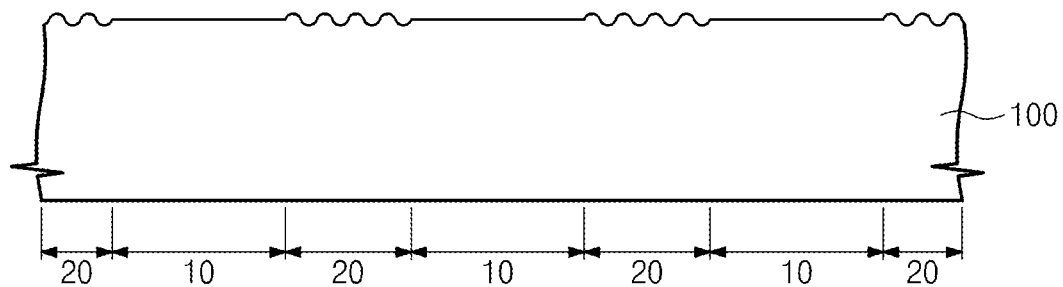
FIGS. 3A to 3D are cross-sectional views illustrating a practical application of a method of fabricating an electronic circuit according to exemplary embodiments of the present invention, taken along line I-I' in FIG. 1.
Figure 3B:
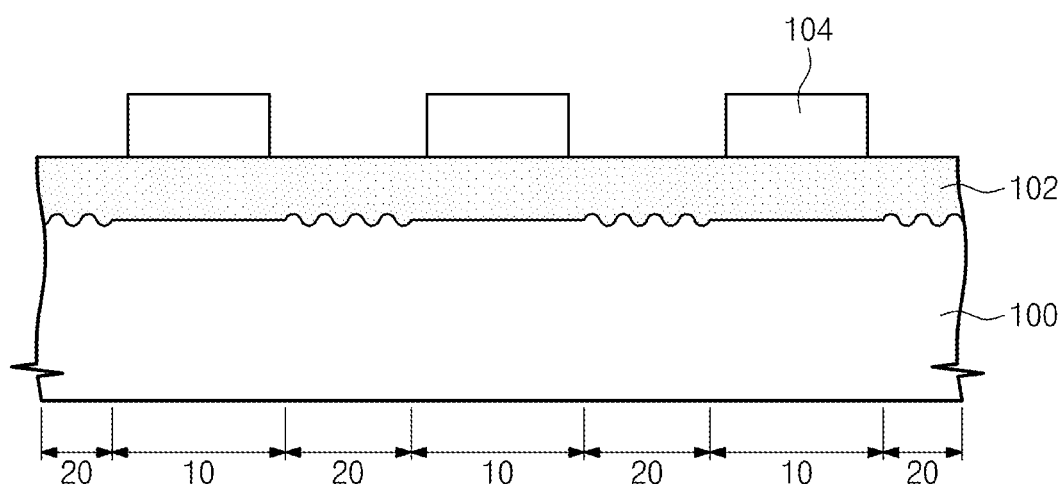

Referring to the FIG. 3B, a polymer film 102 is formed on the substrate 100 and then a photoresist pattern 104 is formed on the polymer film 102. In detail, the photoresist pattern 104 may be formed on the device region 10 of the substrate 100.

Figure 3C:
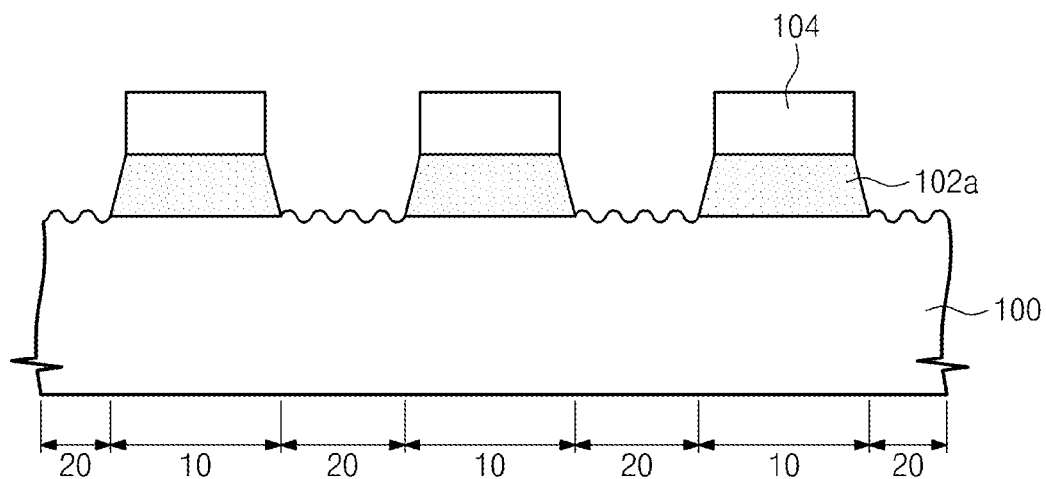

Referring to the FIG. 3C, the polymer pattern 102a is formed by etching the polymer film 102 exposed to the photoresist pattern 104. An etched region of the polymer film 102 is a portion of the polymer film 102 formed on the wiring region 20 of the substrate 100. Therefore, the wiring region 20 of the substrate 100 may be exposed.

Figure 3D:
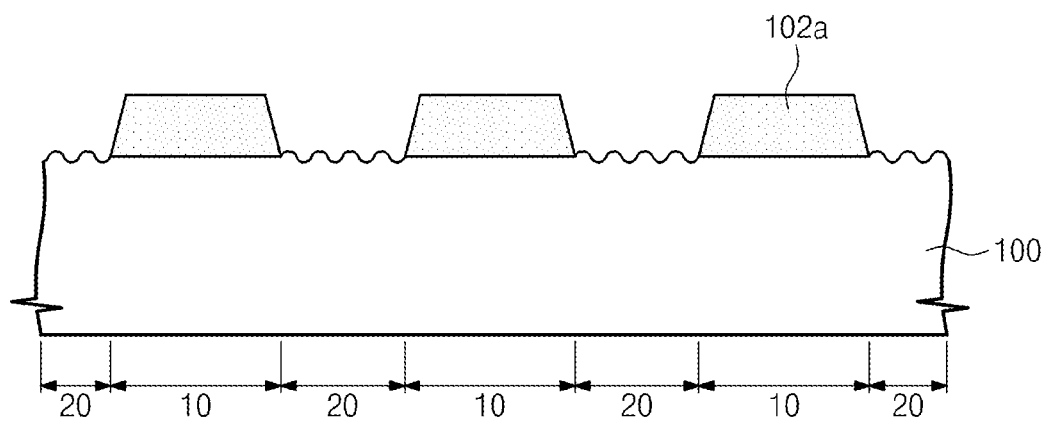

Referring to the FIG. 3D, the photoresist pattern 104 is removed. The photoresist pattern 104 may be removed by an ashing process. Since subsequent processes are the same as those in FIGS. 2F to 2I, description thereof is omitted.

FIGS. 4A to 4I are cross-sectional views illustrating a method of fabricating an electronic circuit according to other exemplary embodiments of the present invention, taken along line I-I' in FIG. 1. For simplicity of description, in the other embodiments shown in FIGS. 4A to 4I, like reference numerals are used to designate like elements and description thereof will be omitted.

Figure 4A:
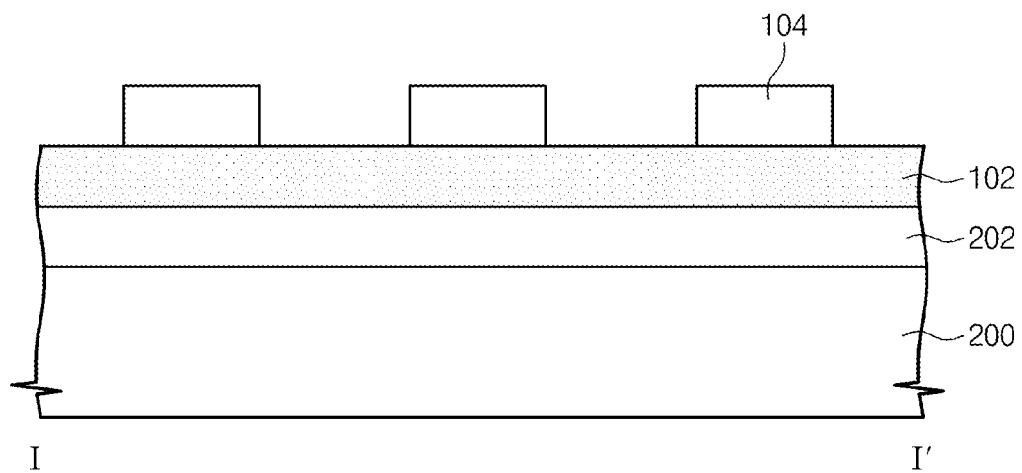
FIGS. 4A to 4I are cross-sectional views illustrating a method of fabricating an electronic circuit according to other exemplary embodiments of the present invention, taken along line I-I' in FIG. 1.

Referring to FIG. 4A, a sacrificial film 202, the polymer film 102 and the photoresist pattern 104 are sequentially formed on a first substrate 200. The first substrate 200 may be formed of a rigid material, such as silicone or a glass.

The sacrificial film 202 may include a material removable by water or a solvent, for example, poly(methacrylate) (PMMA), a photoresist, or poly(3,4-etylenedioxythiophene) (PEDOT).

Figure 4B:
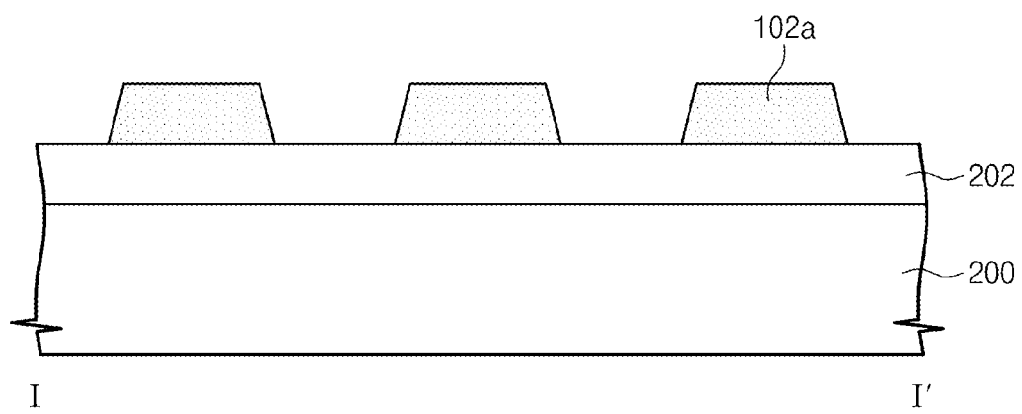

Referring to FIG. 4B, the polymer film 102 is patterned by using the photoresist pattern 104 as an etching mask to form the polymer pattern 102a on the sacrificial film 202. The photoresist pattern 104 remaining on the polymer pattern 102a is removed.

Figure 4C:
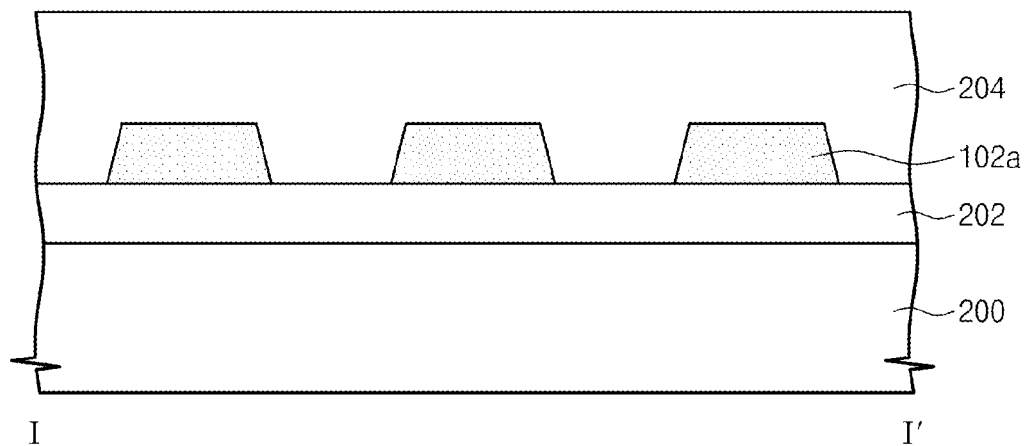

Referring to FIG. 4C, a second substrate 204 is formed on the sacrificial film 202. The second substrate 204 may be formed to cover the polymer pattern 102a. The second substrate 204 may include a stretchable elastomer material, such as poly-dimethylsiloxane (PDMS). The second substrate 204 may be formed by coating the stretchable elastomer material on the sacrificial film 202 through a direct coating, a spin coating, a bar coating, or a printing process and then curing the coated stretchable elastomer material through heat treatment. The heat treatment may be conducted to such a degree that the elasticity of the second substrate 204 is maintained. The heat treatment temperature may be about 300° C. or less.

Figure 4D:
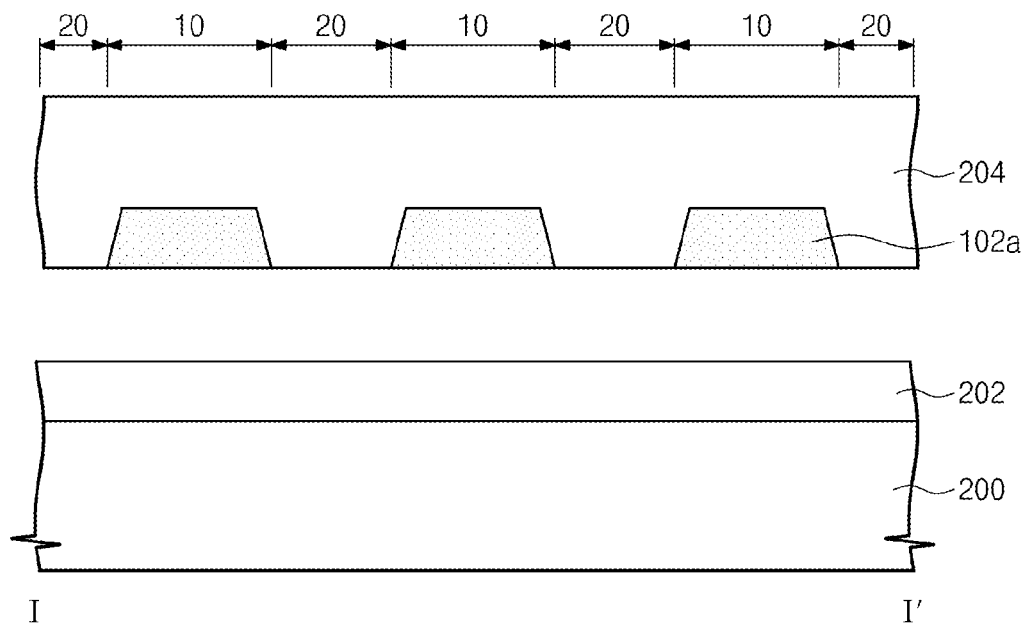

Referring to FIGS. 1 and 4D, the second substrate 204 may be separated from the sacrificial film 202. For example, the second substrate 204 and the sacrificial film 202 may be separated by using a solvent selectively dissolving (for example, wet etching) the sacrificial film 202, or by removing (for example, laser lift off) a bonding energy between the second substrate 204 and the sacrificial film 202. The second substrate 204 separated from the sacrificial film 202 may include the polymer pattern 102a embedded therein. A bottom surface and a side surface of the polymer pattern 102a are embedded in the second substrate 204 and an upper surface of the polymer pattern 102a may be exposed to a surface of the second substrate 204. The second substrate 204 includes the device region 10 and the wiring region 20. The device region 10 is a region in which the polymer pattern 102a is embedded and the wiring region 20 is a remaining region of the second substrate 204 in which the polymer pattern 102a is not embedded.

Figure 4E:
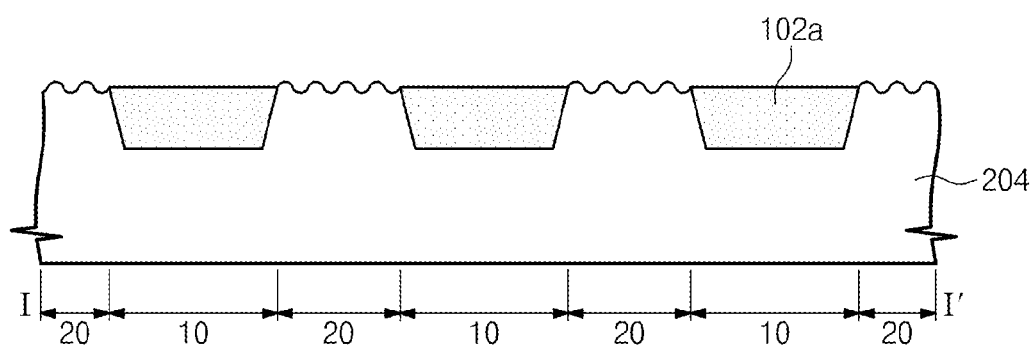

Referring to FIGS. 1 and 4E, the wiring region 20 of the second substrate 204 is formed to have a wrinkled surface. In detail, the wiring region 20 may alternately and repeatedly have a concave surface and a convex surface.

Figure 4F:
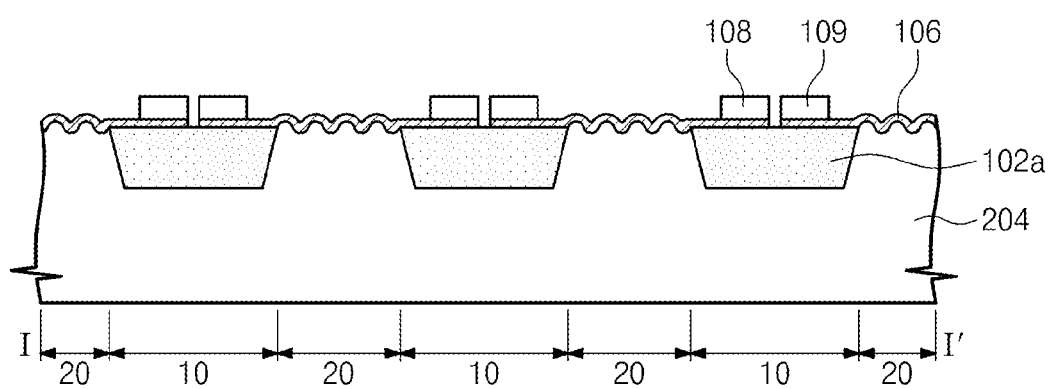

Referring to FIGS. 1 and 4F, the metal wiring 106 is formed on the wiring region 20 of the second substrate 204. The metal wiring 106 is conformally formed on the wiring region 20 to have the same profile as the surface of the wiring region 20. The metal wiring 106 may be formed to extend from the surface of the wiring region 20 to an upper surface of the polymer pattern 102a.

A source electrode 108 and a drain electrode 109 are formed on the polymer pattern 102a on which the metal wiring 106 is formed. The source and drain electrodes 108 and 109 may be formed to be electrically separated from each other.

Figure 4G:
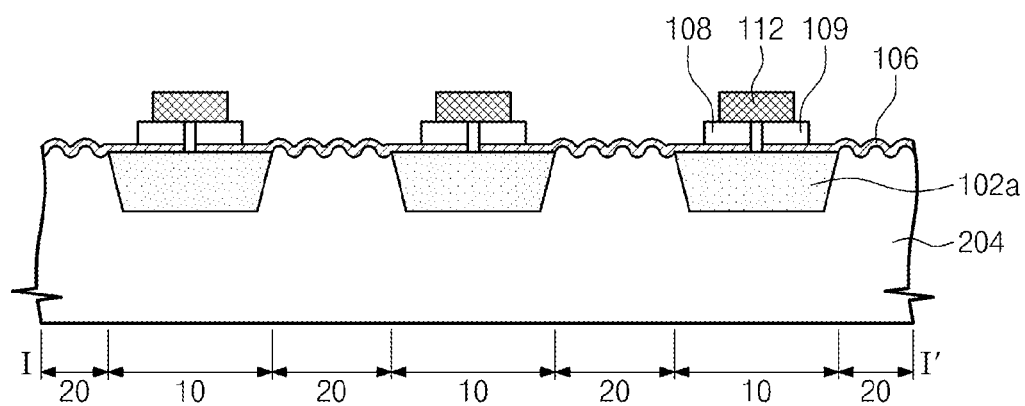
Figure 4H:
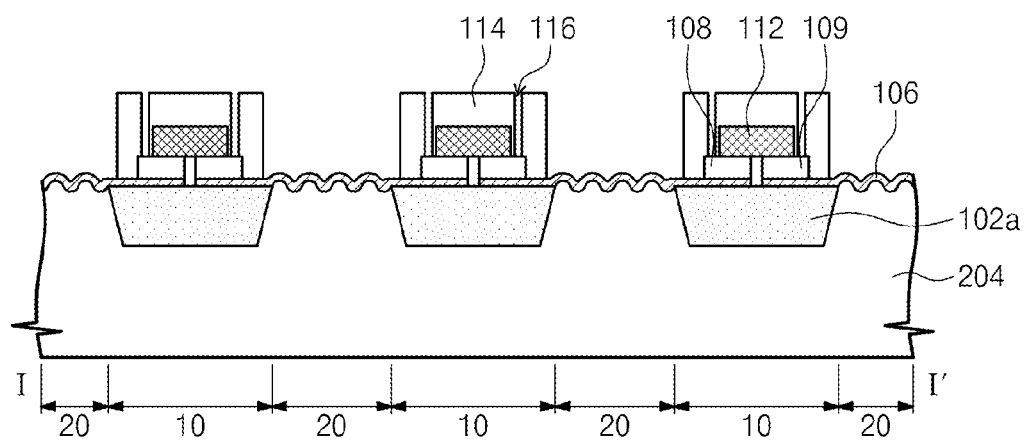
Figure 4I:
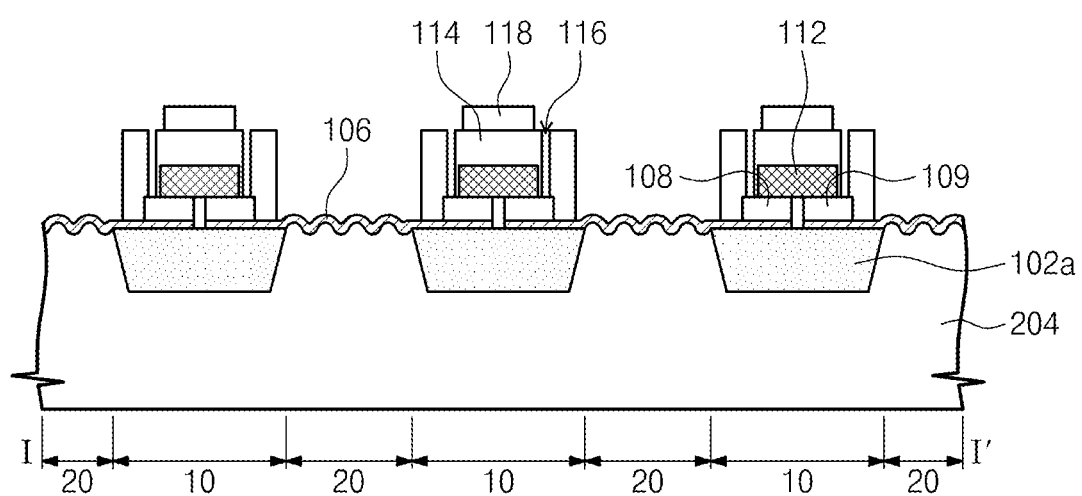

Referring to FIGS. 1, and 4G and 4I, the semiconductor layer 112 is formed on the source electrode 108 and the drain electrode 109.

The gate insulating layer 114 is formed on the semiconductor layer 112 and the via holes 116 passing through the gate insulating layer 114 are formed.

The gate electrode 118 is formed on the gate insulating layer 114 between the via holes 116.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating an electronic circuit, the method comprising:
   preparing a substrate including a device region and a wiring region;
   forming a polymer film on the substrate;
   patterning the polymer film to form a first polymer pattern on the device region of the substrate; and
   forming an electronic device on the first polymer pattern;
   forming a first metal wiring conformally on the wiring region, the first metal wiring being disposed on an upper surface of the first polymer pattern, between the first polymer pattern and the electronic device.

2. The method of claim 1, wherein patterning the polymer film comprises:
   forming a photoresist pattern on the polymer film;
   etching a portion of the polymer film exposed by the photoresist pattern;
   selectively removing the photoresist pattern; and
   performing a heat treatment process to cure the polymer pattern.

3. The method of claim 1, wherein the polymer film comprises a polyimide.

4. The method of claim 1, further comprising forming a second metal wiring disposed on a second surface of the polymer pattern, the second metal wiring being spaced apart from the first metal wiring.

5. The method of claim 4, wherein the first metal wiring is disposed on a second polymer pattern, electrically connecting the electronic device on the first polymer pattern to an electronic device on the second polymer pattern.

6. The method of claim 1, wherein forming the electronic device comprises:
   forming a source electrode and a drain electrode on the polymer pattern;
   forming a semiconductor layer on the source electrode and the drain electrode;
   forming a gate insulating layer that covers the source electrode, the drain electrode, and the semiconductor layer; and
   forming a gate electrode on the gate insulating layer.

7. The method of claim 1, wherein the wiring region comprises a repeating array of alternating concave and convex surfaces on a portion of the substrate, the device region being defined by the wiring region,
   wherein the repeating array of the alternating concave and convex surfaces of the wiring region is formed after the first polymer pattern is formed.

8. The method of claim 7, wherein the device region comprises a flat surface.

9. The method of claim 8, wherein patterning the polymer film comprises forming a photoresist pattern on the device region of the substrate and etching a portion of the polymer film on the wiring region of the substrate by using the photoresist pattern as an etching mask.

10. The method of claim 7, wherein the device region includes a repeating array of alternating concave and convex surfaces.

11. A method of fabricating an electronic circuit, the method comprising:
preparing a first substrate;
forming a sacrificial film and a polymer film on the substrate;
patterning the polymer film to form a polymer pattern on the sacrificial film;
forming a second substrate covering the polymer pattern on the sacrificial film;
separating the second substrate from the sacrificial film to form the second substrate in which the polymer pattern is embedded; and
forming an electronic device on the polymer pattern.

12. The method of claim 11, wherein the polymer pattern comprises a cured polyimide.

13. The method of claim 11, wherein the forming of the second substrate comprises:
applying a stretchable elastomer material on the sacrificial film; and
curing the stretchable elastomer material through a heat treatment process.

14. The method of claim 13, wherein the stretchable elastomer material comprises a poly-dimethylsiloxane (PDMS).

15. The method of claim 11, wherein the second substrate comprises a wiring region other than a device region and the device region in which the polymer pattern is formed, and
wherein prior to forming the electronic device, a concave surface and a convex surface are alternately and repeatedly formed on the wiring region of the substrate.

16. The method of claim 15, further comprising forming a metal wiring on the wiring region of the second substrate, wherein the metal wiring extends to an upper surface of the polymer to be electrically connected to the electronic device.

17. A method of fabricating an electronic circuit, the method comprising:
preparing a substrate;
forming a polymer film on the substrate;
patterning the polymer film to form a polymer pattern; and
forming an electronic device on the polymer pattern, including:
forming a source electrode and a drain electrode on the polymer pattern;
forming a semiconductor layer on the source electrode and the drain electrode;
forming a gate insulating layer covering the source electrode, the drain electrode, and the semiconductor layer; and
forming a gate electrode on the gate insulating layer.

18. A method of fabricating an electronic circuit, the method comprising:
preparing a substrate including a device region and a wiring region, the device region being defined by the wiring region;
forming a polymer film on the substrate;
patterning the polymer film to form a polymer pattern;
forming a repeating array of alternating concave and convex surfaces on the wiring region after the polymer pattern is formed; and
forming an electronic device on the polymer pattern.

* * * * *